(12) United States Patent
Shul et al.

(10) Patent No.: US 11,664,238 B1
(45) Date of Patent: May 30, 2023

(54) PLASMA-BASED METHOD FOR DELAYERING OF CIRCUITS

(71) Applicant: National Technology & Engineering Solutions of Sandia, LLC, Albuquerque, NM (US)

(72) Inventors: Randy J. Shul, Baltimore, MD (US); Caitlin Rochford Friedman, Albuquerque, NM (US); Gregory Paul Salazar, Rio Rancho, NM (US); Michael J. Rye, Albuquerque, NM (US); John Mudrick, Albuquerque, NM (US); Craig Y. Nakakura, Corrales, NM (US); Jeffry Joseph Sniegowski, Tijeras, NM (US); Karl Douglas Greth, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 174 days.

(21) Appl. No.: 16/941,676

(22) Filed: Jul. 29, 2020

Related U.S. Application Data

(60) Provisional application No. 62/894,235, filed on Aug. 30, 2019.

(51) Int. Cl.
*H01L 21/3213* (2006.01)
*H01L 21/321* (2006.01)

(52) U.S. Cl.
CPC ............... *H01L 21/32136* (2013.01); *H01L 21/32115* (2013.01)

(58) Field of Classification Search
None
See application file for complete search history.

(56) References Cited

U.S. PATENT DOCUMENTS

| 7,504,337 | B2* | 3/2009 | Barton et al. | H01L 22/24 |
| | | | | 438/692 |
| 2004/0082176 | A1* | 4/2004 | Kane et al. | G01N 21/68 |
| | | | | 257/E21.252 |

(Continued)

OTHER PUBLICATIONS

Blain, M. G. et al., "High-resolution submicron retarding field energy analyzer for low-temperature plasma analysis," Applied Physics Letters (1999) 75(25):3923-3925.
Boit, C. et al., "Impact of Back Side Circuit Edit on Active Device Performance in Bulk Silicon ICs," International Test Conference (2005) Paper 48.2, 9 pages.
Boit, C. et al., "Physical Techniques for Chip-Backside IC Debug in Nanotechnologies," IEEE Design & Test of Computers (2008) pp. 250-257.
Boit, C., "New physical techniques for IC functional analysis of on-chip devices and interconnects," Applied Surface Science (2005) 252:18-23.

(Continued)

*Primary Examiner* — Stephanie P Duclair
(74) *Attorney, Agent, or Firm* — Mark A. Dodd

(57) ABSTRACT

The present invention relates to methods of delayering a semiconductor integrated circuit die or wafer. In at least one aspect, the method includes exposing a die or wafer to plasma of an etching gas and detecting exposure of one or more metal layers within the die. In one aspect of the invention, the plasma of the etching gas is non-selective and removes all materials in a layer at about the same rate. In another aspect of the invention, two different plasmas of corresponding etching gases are employed with each plasma of the etching gas being selective, thus necessitating the sequential use of both plasmas of corresponding etching gases to remove all materials in a layer.

9 Claims, 6 Drawing Sheets

(56) References Cited

U.S. PATENT DOCUMENTS

2013/0118896 A1* 5/2013 Foster et al. ............. G01N 1/32
204/298.36

OTHER PUBLICATIONS

Carver, C. T. et al., "Atomic Layer Etching: An Industry Perspective," ECS Journal of Solid State Science and Technology (2015) 4(6):N5005-N5009.

Chen, K.-A. et al., "Design-for-Debug Layout Adjustment for FIB Probing and Circuit Editing," International Test Conference (2011) Paper 10.2, 9 pages.

Gutsche, M. U. et al., "Patterning of 0.175 um platinum features using Ar/O2 chemically assisted ion-beam etching," J. Vac. Sci. Technolo. B. (2000) 18(2):765-773.

Hopwood, J., "Ion bombardment energy distributions in a radio frequency induction plasma," Appl. Phys. Lett. (1993) 62(9):940-942.

Huard, C. M. et al., "Atomic layer etching of 3D structures in silicon: Self-limiting and nonideal reactions," J. Vac. Sci. Technol A (2017) 35(3):031306-1-031306-15.

Intlvac Thin Film Corporation, "Understanding Ion Beam Etching (Milling)," Jun. 12, 2018, 5 pages.

Kanarik, K. J. et al., "Atomic Layer Etching: Rethinking the Art of Etch," J. Phys. Chem. Lett. (2018) 9:4814-1821.

Kanarik, K. J. et al., "Overview of atomic layer etching in the semiconductor industry," J. Vac. Sci. Technol. A. (2015) 33(3):020802-1-020802-14.

Paniccia, M. et al., "Novel Optical Probing and Micromachining Techniques for Silicon Debug of Flip Chip Packaged Microprocessors," Microelectronic Engineering (1999) 46:27-34.

Schlangen, R. et al., "Electrical Performance Evaluation of FIB Edited Circuits through Chip Backside Exposing Shallow Trench Isolations," Microelectronics Reliability (2005) 45:1544-1549.

Schlangen, R. et al., "Physical analysis, trimming and editing of nanoscale IC function with backside FIB processing," Microelectronics Reliability (2009) 49:1158-1164.

Vitale, S. A. et al., "Silicon etching yields in F2, Cl2, Br2, and HBr high density plasmas," J. Vac. Sci. Technol. A 2001) 19(5):2197-2206.

Wang, D. D. et al., "Two planar polishing methods by using FIB technique: Toward ultimate top-down delayering for failure analysis," AIP Advances (2015) 5:127101, 9 pages.

Woodworth, J. R. et al., "Ion energy distributions at rf-biased wafer surfaces," J. Vac. Sci. Technol. A. (2002) 20 (3):873-886.

* cited by examiner

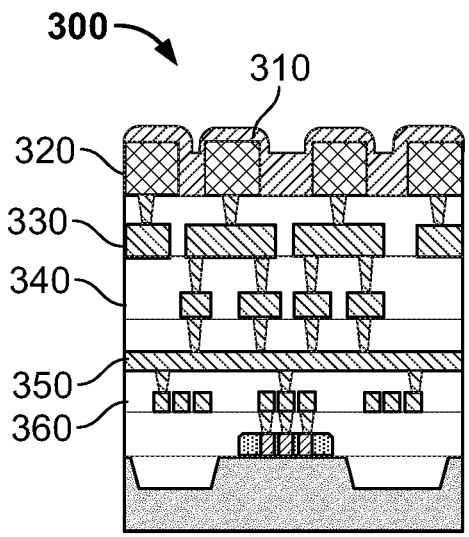
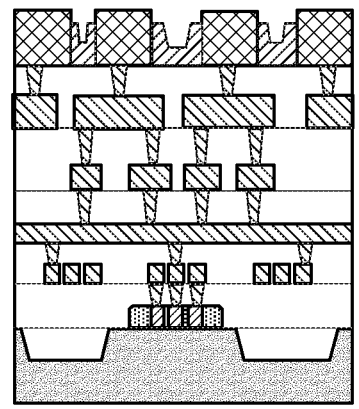
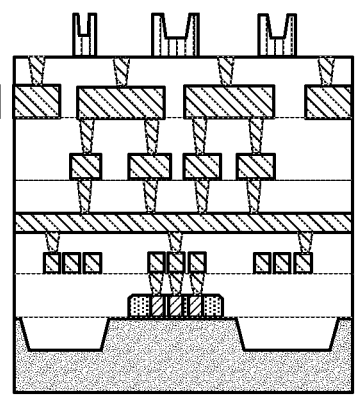
FIG. 3A     FIG. 3B     FIG. 3C
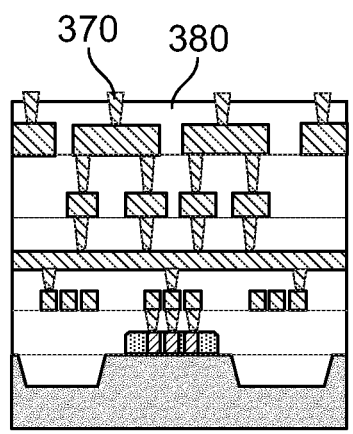
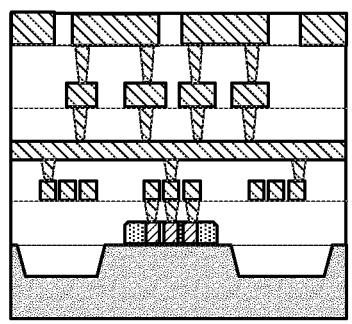
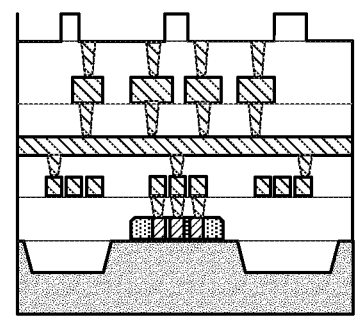
FIG. 3D     FIG. 3E     FIG. 3F
(PRIOR ART)

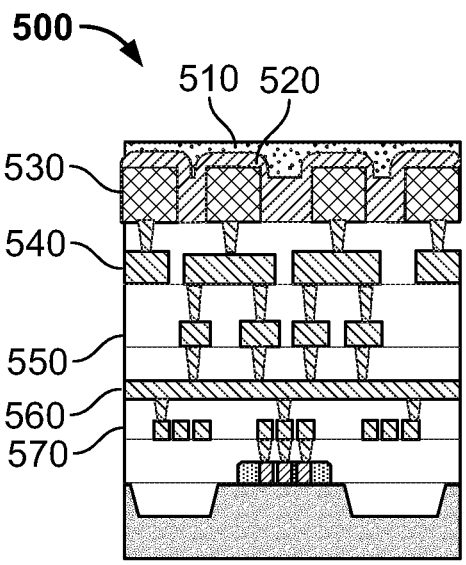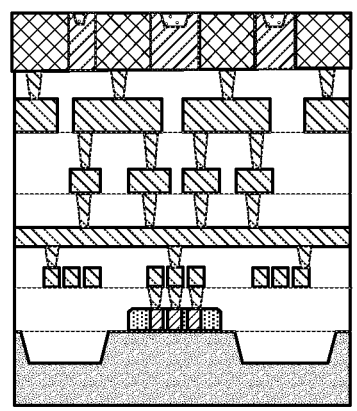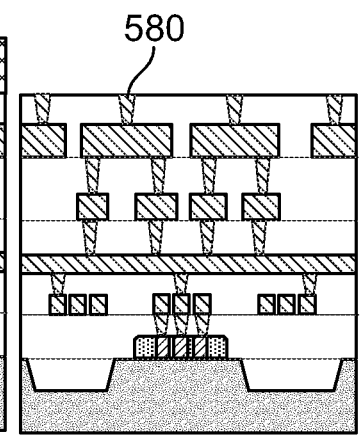
FIG. 5A                FIG. 5B                FIG.5C
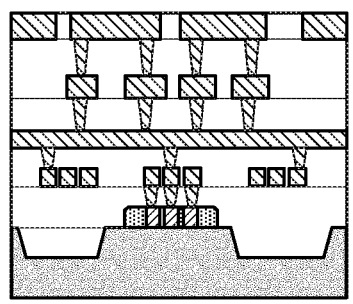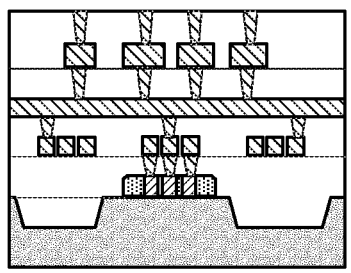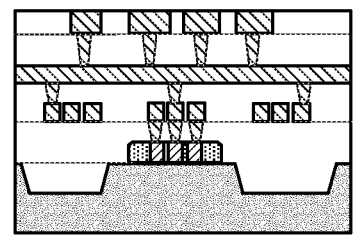
FIG. 5D                FIG. 5E                FIG. 5F

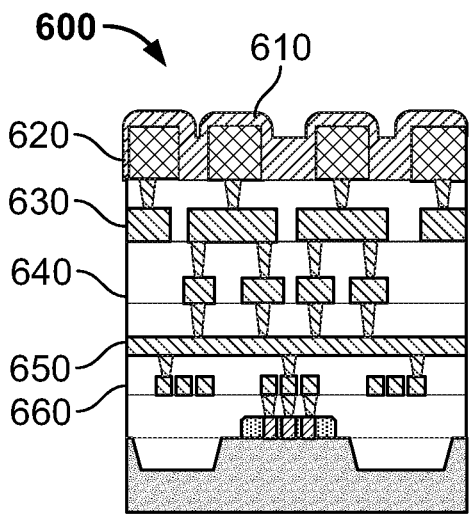
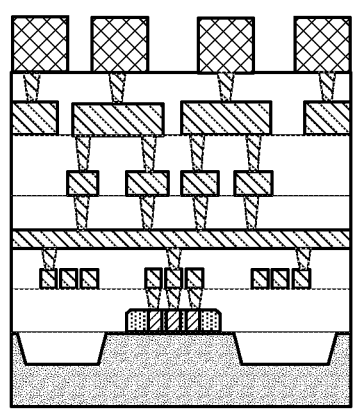
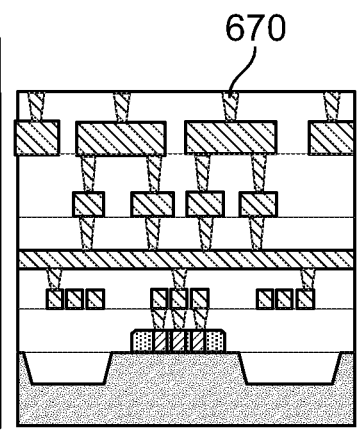
FIG. 6A    FIG. 6B    FIG. 6C
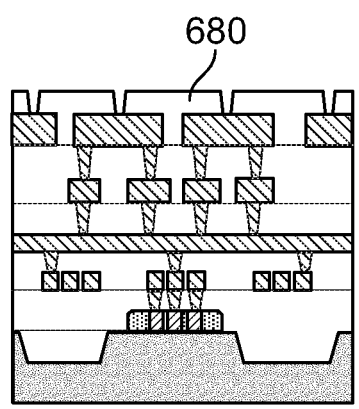
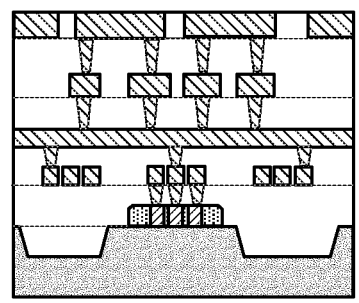
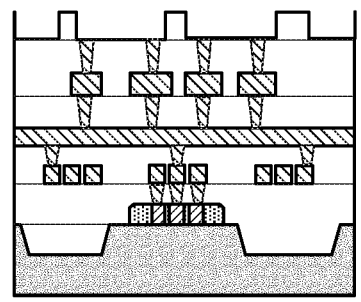
FIG. 6D    FIG. 6E    FIG. 6F

PLASMA-BASED METHOD FOR DELAYERING OF CIRCUITS

RELATED APPLICATIONS

This application claims priority to U.S. Provisional Application No. 62/894,235, filed on Aug. 30, 2019, and entitled PLASMA-BASED METHOD FOR DELAYERING OF CIRCUITS, the entirety of which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

TECHNICAL FIELD

The present invention relates to methods of delayering a semiconductor die or wafer. In one instance, the method includes exposing a semiconductor die to plasma of an etching gas and detecting exposure of one or more metal layers within the die.

BACKGROUND

Integrated circuits (ICs) are often designed as an inverted pyramid with the smallest features at the bottom of the device layer, which is located on the surface of the silicon substrate. As the structure is vertically built up with multiple metal layers, it is typical that subsequent layers become larger in both width and thickness. Generally, the top most metal layer of the IC has both the thickest and widest metal lines on the device. In addition, each metal layer may contain metal chemical mechanical polish (CMP) dummy structures that minimize film stress and improve planarization of the films to ensure reliable device structures and minimize the foot-print of the architecture. Modern IC technology node layout often contains eight or more metal layers with large upper metal layers obscuring underlying device layers.

Delayering silicon ICs is a key aspect for failure analysis (FA) that typically incorporates a variety of mechanical and chemical process tools in combination with imaging capabilities to examine the IC architecture. Delayering requires uniform removal of each layer of an IC so faults or defects may be identified and isolated.

Traditional delayering typically includes a three-step process for each metal layer: an anisotropic plasma-based reactive ion etch (RIE) to remove the dielectric films, followed by an isotropic wet chemical etch to remove the metal layer and vias, and finally a mechanical or chemical mechanical polishing step to planarize the layers and minimize any topography created in the first two steps. As device nodes continue to shrink, the number of metal layers increases, device density increases, and layer thickness decreases. This trend has increased both the complexity of delayering and the time it takes to delayer modern devices.

Another method to delayer an IC involves using the dual-beam Focus Ion Beam/Scanning Electron Microscope (FIB/SEM) system, in which the layers are removed using the FIB with gas-assist chemistry. The SEM is used to obtain high-resolution images of the IC in situ following the removal of each layer or at shorter intervals depending on the desired detail. This gas-assist chemistry can be used either in a conventional Liquid Metal Ion Source (LMIS) Ga ion-based FIB or in a Plasma-FIB (PFIB) using a xenon (Xe) ion beam. The gas-assist methods enable controlled delayering, in which metal features as well as insulating films are removed at comparable rates. This results in a very uniform, planar removal process that can be used in situ, sequentially with high resolution imaging techniques to reconstruct IC architectures in a layer-by-layer process.

Both FEI and Tescan use such processes in their respective PFIB commercially available tools using proprietary chemistries called Dx and AMAZE. There are some limitations to these processes. First, using the process in a conventional LMIS FIB, the delayer area is constrained to tens of square microns (less than $25 \times 25$ µm) to achieve uniform layer removal. This constraint is due to the relatively low ion beam currents generated in the Ga-FIB (65 nA) and the poor distribution of the gas along the surface of the die. Second, in a PFIB, the areas for delayering are significantly larger, in which $400 \times 400$ µm has been reported routinely in the literature with $1 \times 1$ mm being possible. This is primarily due to the much larger beam currents generated in the PFIB (2.5 µA), as compared to the Ga-FIB. Although this is a significant improvement it does not approach the dimensions of a full die (often square centimeters). In order to delayer an entire die, one would need to sequentially delayer smaller fields of view (FOVs) and stitch the resulting images together. This is very time consuming and generally requires deprocessing at least two die to ensure overlapping of their respective FOVs.

Shrinking semiconductor device nodes have greatly contributed to providing higher density, higher performing integrated circuits. Yet, diminishing feature sizes have also provided challenges to conventional techniques that must reliably analyze such devices for structural compliance, failures, or other errors. Accordingly, there is a need for additional methods and techniques to provide more effective analysis of such devices.

SUMMARY

The present invention relates, in part, to methods of removing material from a die using a plasma-based process. Such methods can be employed, e.g., to remove material with atomic layer precision and/or to provide front-side delayering applications. In particular embodiments, the methods provide a die having removed material (e.g., as in an etched die or a delayered die, such as by any method described herein).

Key aspects of the invention described herein include the ability to uniformly delayer entire die (square centimeters), or entire wafers, without the need to stitch FOVs using appropriate chemistry in a plasma etch tool. Plasma etch tools include but are not limited to Reactive Ion Etch (RIE) and Inductively Coupled Plasma (ICP). The ICP may be the most flexible tool since the ion current, free radical density, and ion energy can be independently controlled. Such flexibility and control of the plasma conditions enable uniform removal of layers similar to that observed in the PFIB but over a much larger area. In addition, Reactive Ion Beam Etch (RIBE), Chemically Assisted Ion Beam Etch (CAIBE), and plasma jet etch systems can be used. Using plasma-generated chemistries, the area of delayering would only be limited to the dimension of the vacuum chamber (often > 30 cm diameter). Another benefit is that the material removal would not be affected by bow, which increases with die size and adds difficulty to traditional delayering.

In at least one embodiment of the present invention, a method comprises providing a die (the die including a device layer, a conductive layer {the conductive layer including a first metal layer in proximity to a back-side surface of the conductive layer, the first metal layer including a first metal portion and a first intralayer dielectric, a second metal layer in proximity to a front-side surface of the conductive layer, the second metal layer including a second metal portion and a second intralayer dielectric, a plurality of first vias disposed between the first metal layer and the second metal layer, and a first interlayer dielectric disposed between the first metal layer and the second metal layer}, and a contact layer {the contact layer including a passivation layer, a third metal layer, and a second interlayer dielectric disposed between the second metal layer and the third metal layer, wherein the conductive layer is disposed between a front-side surface of the device layer and a back-side surface of the contact layer}), etching at least a portion of a front-side surface of the contact layer to expose at least a portion of the second metal layer (thereby providing an etched die), exposing the etched die to a first plasma etch employing a first etching gas (the first plasma etch removing at least a portion of the second metal layer, the first plasma etch being non-selective, the first plasma etch adapted to remove the second metal portion and the second intralayer dielectric at about the same rate), exposing the etched die to a second plasma etch employing a second etching gas (the second plasma etch removing at least a portion of the plurality of first vias and a portion of the first interlayer dielectric, the second plasma etch being non-selective, the second plasma etch adapted to remove the plurality of first vias and the first interlayer dielectric at about the same rate), and detecting exposure of the first metal layer, thereby providing a delayered die.

In various embodiments of the present invention, the etching step includes removing at least a portion of the passivation layer or at least a portion of the third metal layer; the etching step includes polishing at least a portion of the front-side surface of the contact layer to remove at least a portion of the passivation layer or at least a portion of the third metal layer; the first or second etching gas includes a hydrocarbon, a halogen, a fluorocarbon, a carbonyl, or an acetate; the first and second etching gases are the same or different; the contact layer further includes a planarization layer disposed on a front-side surface of the passivation layer; and the method further comprises, after the providing step, depositing a planarization layer on a front-side surface of the contact layer, the etching step including etching at least a portion of the planarization layer.

In other embodiments of the present invention, the method further comprises, after the detecting exposure step, exposing the delayered die to a third plasma etch employing a third etching gas (the third plasma etch removing at least a portion of the first metal layer, the third plasma etch being non-selective, the third plasma etch adapted to remove the first metal portion and the first intralayer dielectric at about the same rate); the conductive layer further includes a plurality of third vias disposed between the device layer and the first metal layer, and a third interlayer dielectric disposed between the device layer and the first metal layer; and the method further comprises, after exposing the delayered die to a third plasma etch step, exposing the delayered die to a fourth plasma etch employing a fourth etching gas (the fourth plasma etch removing at least a portion of the plurality of third vias and a portion of the third interlayer dielectric, the fourth plasma etch being non-selective, the fourth plasma etch adapted to remove the plurality of third vias and the third interlayer dielectric at about the same rate).

In at least one embodiment of the present invention, a method comprises providing a die (the die including a device layer, a conductive layer {the conductive layer including a first metal layer in proximity to a back-side surface of the conductive layer, the first metal layer including a first metal portion and a first intralayer dielectric, a second metal layer in proximity to a front-side surface of the conductive layer, the second metal layer including a second metal portion and a second intralayer dielectric, a plurality of first vias disposed between the first metal layer and the second metal layer, and a first interlayer dielectric disposed between the first metal layer and the second metal layer}, and a contact layer {the contact layer including a passivation layer, a third metal layer, and a second interlayer dielectric disposed between the second metal layer and the third metal layer, wherein the conductive layer is disposed between a front-side surface of the device layer and a back-side surface of the contact layer}), etching at least a portion of a front-side surface of the contact layer to expose at least a portion of the second metal layer (thereby providing an etched die), exposing the etched die to a first plasma etch employing a first etching gas (the first plasma etch removing at least a portion of the second metal portion, the first plasma etch being selective), exposing the etched die to a second plasma etch employing a second etching gas (the second plasma etch removing at least a portion of the second intralayer dielectric, the second plasma etch being selective), exposing the etched die to a third plasma etch employing a third etching gas (the third plasma etch removing at least a portion of the plurality of first vias, the third plasma etch being selective), exposing the etched die to a fourth plasma etch employing a fourth etching gas (the fourth plasma etch removing at least a portion of the first interlayer dielectric, the fourth plasma etch being selective), and detecting exposure of the first metal layer, thereby providing a delayered die.

In various embodiments of the present invention, the etching step includes removing at least a portion of the passivation layer or at least a portion of the third metal layer; the etching step includes polishing at least a portion of the front-side surface of the contact layer to remove at least a portion of the passivation layer or at least a portion of the third metal layer; the first, second, third, or fourth etching gas include a hydrocarbon, a halogen, a fluorocarbon, a carbonyl, or an acetate; the first, second, third, and fourth etching gases are the same or different; the contact layer further includes a planarization layer disposed on a front-side surface of the passivation layer; and the method further comprises, after the providing step, depositing a planarization layer on a front-side surface of the contact layer, the etching step including etching at least a portion of the planarization layer.

In other embodiments of the present invention, the method further comprises, after the detecting exposure step, exposing the delayered die to a fifth plasma etch employing a fifth etching gas (the fifth plasma etch removing at least a portion of the first metal portion, the fifth plasma etch being selective), and exposing the delayered die to a sixth plasma etch employing a sixth etching gas (the sixth plasma etch removing at least a portion of the first intralayer dielectric, the sixth plasma etch being selective); the conductive layer further including a plurality of third vias disposed between the device layer and the first metal layer, and a third interlayer dielectric disposed between the device layer and the first metal layer; and the method further comprises, after the exposing the delayered die to a sixth plasma etch step, exposing the delayered die to a seventh plasma etch employing a seventh etching gas (the seventh plasma etch removing at least a portion of the plurality of third vias, the seventh plasma etch being selective), and exposing the delayered die to an eighth plasma etch employing an eighth etching gas (the eighth plasma etch removing at least a portion of the third interlayer dielectric, the eighth plasma etch being selective).

Definitions

As used herein, the term "about" means +/- 10% of any recited value. As used herein, this term modifies any recited value, range of values, endpoints of one or more ranges, and rates.

By "micro" is meant having at least one dimension that is less than 1 mm. For instance, a microstructure (e.g., any structure described herein) can have a length, width, height, cross-sectional dimension, circumference, radius (e.g., external or internal radius), or diameter that is less than 1 mm.

By "nano" is meant having at least one dimension that is less than 1 μm. For instance, a nanostructure (e.g., any structure described herein) can have a length, width, height, cross-sectional dimension, circumference, radius (e.g., external or internal radius), or diameter that is less than 1 μm.

As used herein, the terms "top," "bottom," "upper," "lower," "above," and "below" are used to provide a relative relationship between structures. The use of these terms does not indicate or require that a particular structure must be located at a particular location in the apparatus.

As used herein, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form. Additionally, as used herein, the term "exemplary" is intended to mean serving as an illustration or example of something, and is not intended to indicate a preference.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

FIGS. 3A-3F illustrate an exemplary conventional method for etching a die in accordance with the prior art.

FIGS. 5A-5F illustrate an exemplary method for forming a delayered die in accordance with one or more embodiments of the present invention.

FIGS. 6A-6F illustrate an exemplary method for forming a delayered die in accordance with one or more embodiments of the present invention.

DETAILED DESCRIPTION

The present method, in part, relates to methods of removing material from a die to provide a delayered die, in which the method is directed to use of plasma-based processes. In particular embodiments of the present invention, the plasma-based process includes use of a plasma to generate inert ions that bombard a surface, thereby removing material from that surface. In some embodiments of the present invention, the use of a plasma field (e.g., within a plasma chamber) provides material removal from an entire die or an entire wafer.

Figure 1A:
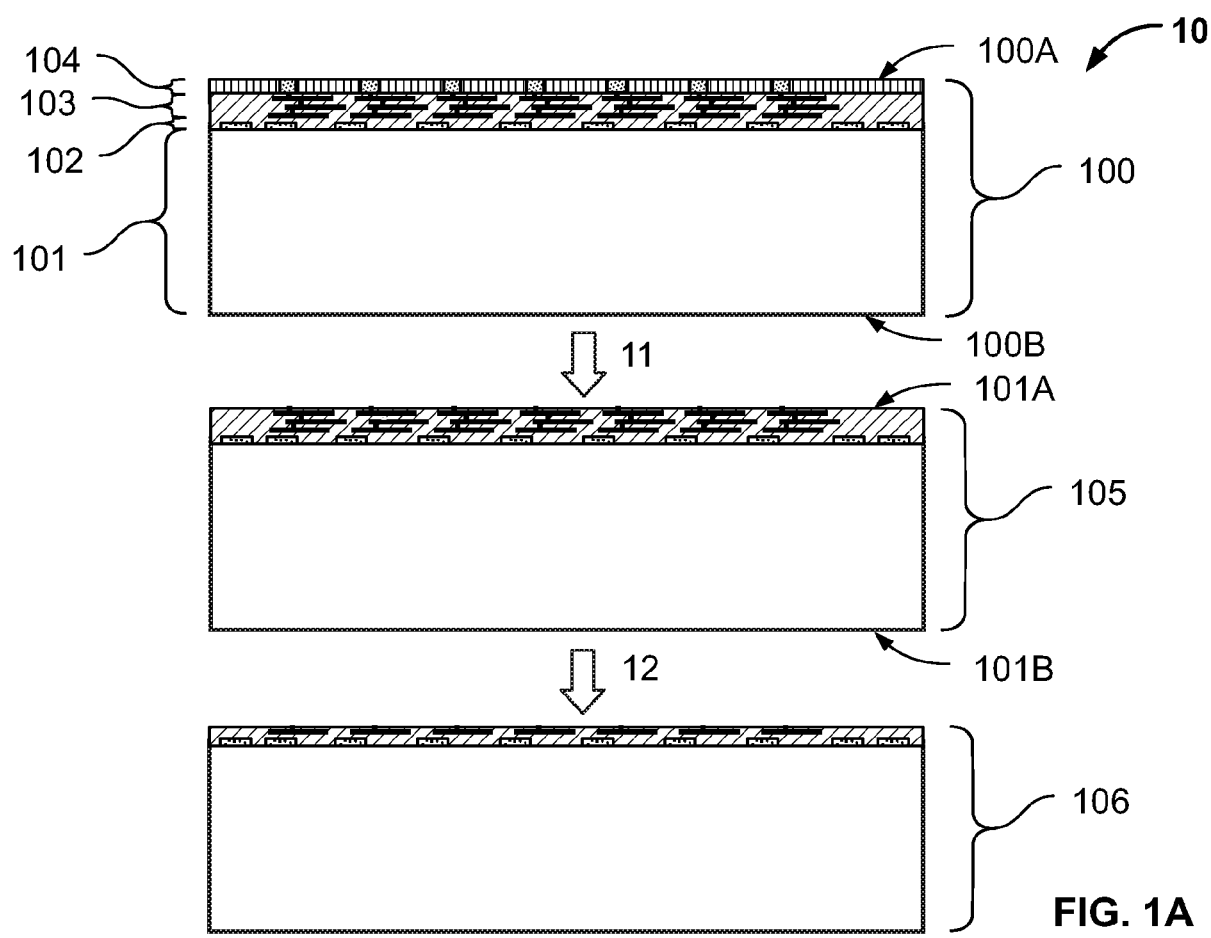
FIGS. 1A-1B illustrate exemplary methods for forming a delayered die in accordance with one or more embodiments of the present invention.

FIG. 1A illustrates an exemplary method 10 for removing material from a die 100 in accordance with one or more embodiments of the present invention. In particular embodiments of the present invention, the die 100 includes a front-side surface 100A and a back-side surface 100B, and each structural element of the die can have a front-side surface (facing surface 100A) and a back-side surface (facing surface 100B).

The die 100 can have any useful structural elements. In some embodiments of the present invention, the die 100 includes a substrate 101, a conductive layer 103, and a device layer 102 disposed between a front-side surface of the substrate 101 and a back-side surface of the conductive layer 103, and a contact layer 104 disposed on a front-side surface of the conductive layer 103. The back-side surface 100B of the die 100 can include a substrate 101, which in turn has a back-side surface 100B and a front-side surface (towards surface 100A). The substrate can include any useful handling structure, such as a handling wafer or a carrier wafer.

The front-side surface 100A of the die 100 can have one or more active areas (e.g., in which each active area can have one or more devices). In some embodiments, the one or more devices or active areas are provided in a device layer 102. Exemplary devices include transistors (e.g., field effect transistors (FETs), fin field effect transistors (fin-FETs), metal oxide semiconductor field effect transistors (MOSFETs), gate-all-around (GAA) structures, high-electron-mobility transistors (HEMTs), tunneling transistors, etc.), diodes (e.g., light emitting diodes (LEDs), laser diodes, photodiodes, etc.), resistors, switches, detectors (e.g., ultraviolet (UV) detectors), memory cells, etc. An electrical connection to one or more devices or active areas can include use of a conductive layer 103, which in turn can include one or more conductive components. Exemplary conductive components include one or more metal layers, metallization layers, routing layers, interconnects, vias, integrated lines, electrodes, contacts, metallic liners, etc. The die 100 or substrate 101 can have any other additional components and layers. Exemplary components include one or more gates, gate spacer structures, capping layers, air spaces, isolation layers, spacer layers, interlayer dielectric layers, intralayer dielectric layers, mask layers, screening layers, heat sink layers, interposers, barrier layers, sacrificial coatings, well regions (e.g., n-wells or p-wells), source regions, drain regions, oxide layers, through-silicon vias, thru layers, etc.

As further illustrated in FIG. 1A, an exemplary method 10 can include providing a die 100 (e.g., any described herein), etching 11 the die to provide an etched die 105, and delayering 12 the die (e.g., the etched die 105) to provide a delayered die 106. In some embodiments, the delayering 12 occurs only on the front-side surface 101A of an etched die 105, rather than at the back-side surface 101B. Etching 11 and delayering 12 of the initial die 100 can provide a delayered die 106 having a height of from about 50 nm to about 10 µm (e.g., from 50 nm to 0.5 µm, 50 nm to 1 µm, 50 nm to 2 µm, 50 nm to 3 µm, 50 nm to 4 µm, 50 nm to 5 µm, 50 nm to 8 µm, 50 nm to 10 µm, 250 nm to 1 µm, 250 nm to 2 µm, 250 nm to 3 µm, 250 nm to 4 µm, 250 nm to 5 µm, 250 nm to 8 µm, 250 nm to 10 µm, 500 nm to 1 µm, 500 nm to 2 µm, 500 nm to 3 µm, 500 nm to 4 µm, 500 nm to 5 µm, 500 nm to 8 µm, 500 nm to 10 µm, 750 nm to 1 µm, 750 nm to 2 µm, 750 nm to 3 µm, 750 nm to 4 µm, 750 nm to 5 µm, 750 nm to 8 µm, 750 nm to 10 µm, 1 µm to 2 µm, 1 µm to 3 µm, 1 µm to 4 µm, 1 µm to 5 µm, 1 µm to 8 µm, 1 µm to 10 µm, 2 µm to 3 µm, 2 µm to 4 µm, 2 µm to 5 µm, 2 µm to 8 µm, 2 µm to 10 µm, 3 µm to 4 µm, 3 µm to 5 µm, 3 µm to 8 µm, 3 µm to 10 µm, 4 µm to 5 µm, 4 µm to 8 µm, 4 µm to 10 µm, 5 µm to 8 µm, or 5 µm to 10 µm). Etching 11 can be accomplished by any useful method, such as by wet chemical etching, reactive ion etching, mechanical or chemical mechanical polishing, computer numerical control (CNC) milling, ultrasonic milling, micromilling, ductile mode machining, micro-end-milling, contour milling, etc.

Figure 1B:
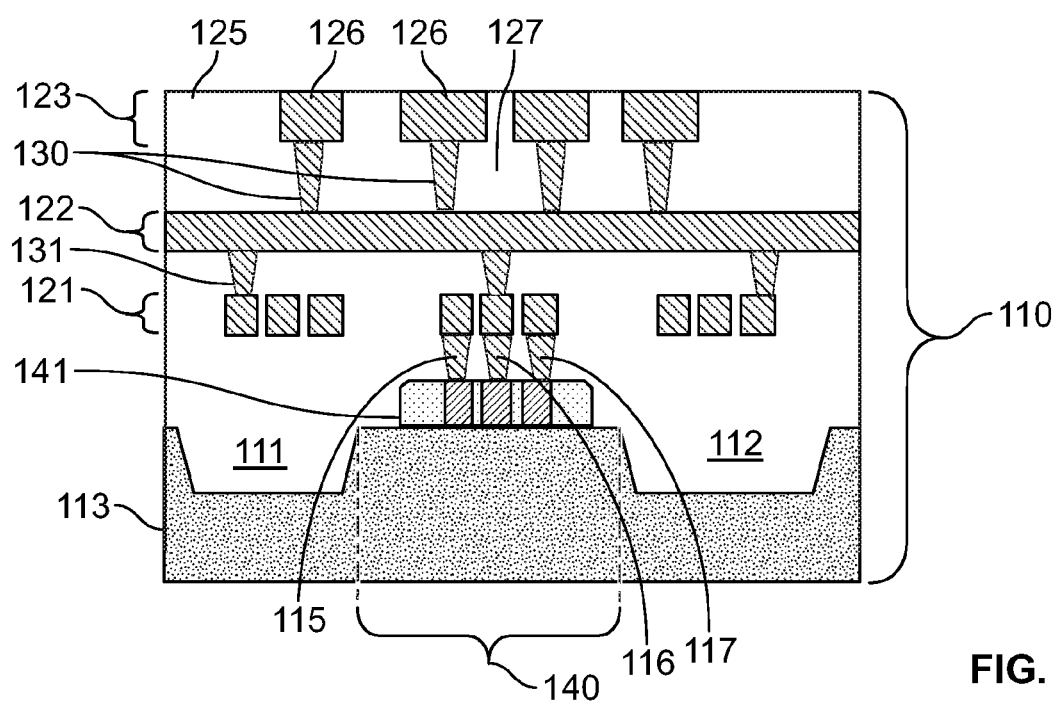

FIG. 1B illustrates an exemplary delayered die 110 having a substrate (e.g., bulk silicon 113) and a device layer 102 having a plurality of shallow trench isolation (STI) regions 111, 112 and an active area 140 disposed between the STIs 111, 112. The active area 140, in turn, can include one or more devices 141 (e.g., any described herein). Such devices 141 can be electrically interconnected using the conductive layer 103 by way of one or more contacts or vias (e.g., vias 115, 116, 117 that electrically connect a component of a device 141, such as a gate, source, drain, contact, etc., with one or more conductive components within the conductive layer 103). As illustrated in FIG. 1B, the conductive layer 103 can include various conductive components, including one or more metal layers, such as a first metal layer 121, a second metal layer 122, and a third metal layer 123. The various metal layers 120, 122, 123 are interconnected using vias 130, 131. The metal layer 123 includes an intralayer dielectric 125 and a metal portion 126. An interlayer dielectric 127 is disposed between the second metal layer 122 and the third metal layer 123.

Delayering 12 can be accomplished by an etching method that employs a plasma to remove material from a front-side surface of a layer (e.g., the conductive layer 103). In one embodiment of the present invention, delayering 12 is accomplished by modifying the die 100 (e.g., a front-side surface of the die 100 or a layer 102, 103, 104) to provide a modified surface and then by exposing the modified surface to a plasma to remove the modified surface from the die 100. Such sequential steps of modifying and exposing can be repeated for any useful number of times (or cycles). For example and without limitation, a single cycle can include a modifying step and an exposing step, as well as any other useful steps (e.g., purging a chamber after the modifying step or after the exposing step). Any useful number of cycles can be employed. In one instance, each cycle removes a single monolayer of the modified surface. In another instance, each cycle removes a layer having a height of from about 0.5 Å to 2 Å (e.g., or any range described herein). In yet another instance, the method includes performing of from about 10 to about 105 cycles, in which each cycle includes a step of modifying (e.g., with an etching gas) and exposing (e.g., to a plasma). In another instance, the method includes etching 11 or delayering 12 performed at a rate of from about 0.01 nm/min to about 5 nm/min (e.g., 0.01 nm/min to 0.1 nm/min, 0.01 nm/min to 0.5 nm/min, 0.01 nm/min to 1 nm/min, 0.01 nm/min to 3 nm/min, 0.05 nm/min to 0.1 nm/min, 0.05 nm/min to 0.5 nm/min, 0.05 nm/min to 1 nm/min, 0.05 nm/min to 3 nm/min, 0.05 nm/min to 5 nm/min, 0.1 nm/min to 0.5 nm/min, 0.1 nm/min to 1 nm/min, 0.1 nm/min to 3 nm/min, 0.1 nm/min to 5 nm/min, 0.5 nm/min to 1 nm/min, 0.5 nm/min to 3 nm/min, 0.5 nm/min to 5 nm/min, or 1 nm/min to 5 nm/min).

In any embodiment of the present invention, the exposing step (e.g., an initial exposing step or a further exposing step) may include removing material from a portion of a layer (e.g., a portion of the metal layer 121, 122, 123) or a plurality of vias 115, 116, 117 to reduce a height of that layer or that via by about 0.1 Å to 5 Å (e.g., from about 0.1 Å to 0.5 Å, 0.1 Å to 1 Å, 0.1 Å to 1.5 Å, 0.1 Å to 2 Å, 0.1 Å to 2.5 Å, 0.1 Å to 3 Å, 0.1 Å to 3.5 Å, 0.1 Å to 4 Å, 0.1 Å to 4.5 Å, 0.5 Å to 1 Å, 0.5 Å to 1.5 Å, 0.5 Å to 2 Å, 0.5 Å to 2.5 Å, 0.5 Å to 3 Å, 0.5 Å to 3.5 Å, 0.5 Å to 4 Å, 0.5 Å to 4.5 Å, 0.5 Å to 5 Å, 1 Å to 1.5 Å, 1 Å to 2 Å, 1 Å to 2.5 Å, 1 Å to 3 Å, 1 Å to 3.5 Å, 1 Å to 4 Å, 1 Å to 4.5 Å, 1 Å to 5 Å, 1.5 Å to 2 Å, 1.5 Å to 2.5 Å, 1.5 Å to 3 Å, 1.5 Å to 3.5 Å, 1.5 Å to 4 Å, 1.5 Å to 4.5 Å, 1.5 Å to 5 Å, 2 Å to 2.5 Å, 2 Å to 3 Å, 2 Å to 3.5 Å, 2 Å to 4 Å, 2 Å to 4.5 Å, 2 Å to 5 Å, 2.5 Å to 3 Å, 2.5 Å to 3.5 Å, 2.5 Å to 4 Å, 2.5 Å to 4.5 Å, 2.5 Å to 5 Å, 3 Å to 3.5 Å, 3 Å to 4 Å, 3 Å to 4.5 Å, 3 Å to 5 Å, 3.5 Å to 4 Å, 3.5 Å to 4.5 Å, 3.5 Å to 5 Å, 4 Å to 4.5 Å, 4 Å to 5 Å, or 4.5 Å to 5 Å).

In any embodiment of the present invention, a remaining thickness of a layer (e.g., a portion of the metal layer 121, 122, 123) or a plurality of vias 115, 116, 117, after an exposing step (e.g., an initial exposing step or a further exposing step) may be from about 50 nm to about 1 µm (e.g., from about 50 nm to 100 nm, 50 nm to 200 nm, 50 nm to 250 nm, 50 nm to 300 nm, 50 nm to 400 nm, 50 nm to 500 nm, 50 nm to 600 nm, 50 nm to 700 nm, 50 nm to 800 nm, 50 nm to 900 nm, 50 nm to 1 µm, 75 nm to 100 nm, 75 nm to 200 nm, 75 nm to 250 nm, 75 nm to 300 nm, 75 nm to 400 nm, 75 nm to 500 nm, 75 nm to 600 nm, 75 nm to 700 nm, 75 nm to 800 nm, 75 nm to 900 nm, 75 nm to 1 µm, 100 nm to 200 nm, 100 nm to 250 nm, 100 nm to 300 nm, 100 nm to 400 nm, 100 nm to 500 nm, 100 nm to 600 nm, 100 nm to 700 nm, 100 nm to 800 nm, 100 nm to 900 nm, 100 nm to 1 µm, 125 nm to 200 nm, 125 nm to 250 nm, 125 nm to 300 nm, 125 nm to 400 nm, 125 nm to 500 nm, 125 nm to 600 nm, 125 nm to 700 nm, 125 nm to 800 nm, 125 nm to 900 nm, 125 nm to 1 µm, 150 nm to 200 nm, 150 nm to 250 nm, 150 nm to 300 nm, 150 nm to 400 nm, 150 nm to 500 nm, 150 nm to 600 nm, 150 nm to 700 nm, 150 nm to 800 nm, 150 nm to 900 nm, 150 nm to 1 µm, 175 nm to 200 nm, 175 nm to 250 nm, 175 nm to 300 nm, 175 nm to 400 nm, 175 nm to 500 nm, 175 nm to 600 nm, 175 nm to 700 nm, 175 nm to 800 nm, 175 nm to 900 nm, 175 nm to 1 µm, 200 nm to 250 nm, 200 nm to 300 nm, 200 nm to 400 nm, 200 nm to 500 nm, 200 nm to 600 nm, 200 nm to 700 nm, 200 nm to 800 nm, 200 nm to 900 nm, 200 nm to 1 µm, 225 nm to 250 nm, 225 nm to 300 nm, 225 nm to 400 nm, 225 nm to 500 nm, 225 nm to 600 nm, 225 nm to 700 nm, 225 nm to 800 nm, 225 nm to 900 nm, 225 nm to 1 µm, 250 nm to 300 nm, 250 nm to 400 nm, 250 nm to 500 nm, 250 nm to 600 nm, 250 nm to 700 nm, 250 nm to 800 nm, 250 nm to 900 nm, 250 nm to 1 µm, 275 nm to 300 nm, 275 nm to 400 nm, 275 nm to 500 nm, 275 nm to 600 nm, 275 nm to 700 nm, 275 nm to 800 nm, 275 nm to 900 nm, 275 nm to 1 µm, 300 nm to 400 nm, 300 nm to 500 nm, 300 nm to 600 nm, 300 nm to 700 nm, 300 nm to 800 nm, 300 nm to 900 nm, 300 nm to 1 µm, 325 nm to 400 nm, 325 nm to 500 nm, 325 nm to 600 nm, 325 nm to 700 nm, 325 nm to 800 nm, 325 nm to 900 nm, 325 nm to 1 µm, 350 nm to 400 nm, 350 nm to 500 nm, 350 nm to 600 nm, 350 nm to 700 nm, 350 nm to 800 nm, 350 nm to 900 nm, 350 nm to 1 µm, 375 nm to 400 nm, 375 nm to 500 nm, 375 nm to 600 nm, 375 nm to 700 nm, 375 nm to 800 nm, 375 nm to 900 nm, 375 nm to 1 µm, 400 nm to 500 nm, 400 nm to 600 nm, 400 nm to 700 nm, 400 nm to 800 nm, 400 nm to 900 nm, 400 nm to 1 µm, 500 nm to 600 nm, 500 nm to 700 nm, 500 nm to 800 nm, 500 nm to 900 nm, 500 nm to 1 µm, 600 nm to 700 nm, 600 nm to 800 nm, 600 nm to 900 nm, 600 nm to 1 µm, 700 nm to 800 nm, 700 nm to 900 nm, 700 nm to 1 µm, 800 nm to 900 nm, 800 nm to 1 µm, and 900 nm to 1 µm).

The modifying step can include use of any reactant that provides a modified surface, in which the bonding characteristic of the surface is weakened or the structural stability of the surface is diminished. Exemplary modifying steps can include exposing a surface (e.g., a front-side surface) to a reactant that interacts or reacts with one or more atoms present on the surface. Non-limiting reactants include chlorine (e.g., HCl, $Cl_2$, $BCl_3$, $SiCl_4$, $SiHCl_3$, Cl ions (such as $Cl^+$ or $Cl_2^+$), or a Cl radical (such as Cl·)), fluorine (e.g., HF, $CF_4$, $F_2$, $C_4F_8$, $SF_6$, $SiF_4$, $SiHF_3$, F ions (such as $CF_3^+$ or $F^+$), or a F radical (such as F·)), bromine (e.g., $SiBr_4$), iodine, etc., in any useful form (e.g., gas phase) or molecule. Such reactants can be provided in any useful form, such as a neutral atom or molecule, a radical, or a molecule. Reactants can be optionally delivered by using a carrier gas, such as an inert carrier gas (e.g., argon, neon, krypton, helium, or xenon).

The exposing step can include use of any atom or molecule that removes at least a portion of the modified surface. Exemplary exposing steps can include exposing the modified surface to a plasma, which in turn generates one or more atomic particles (e.g., ions) to bombard the modified surface. Non-limiting atomic particles can include argon (e.g., $Ar^+$ or Ar plasma), neon (e.g., $Ne^+$, Ne plasma, or Ne neutral beam), krypton (e.g., $Kr^+$), helium, xenon, any inert ion, etc., in any useful form (e.g., plasma, beam, etc.) or molecule. Such particles can be provided in any useful form, such as a neutral atom or molecule, an ion, or a molecule.

Figure 2A:
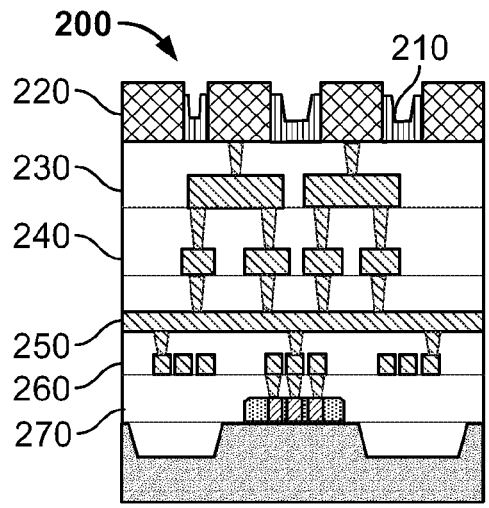
FIGS. 2A-2F illustrate an exemplary conventional method for etching a die in accordance with the prior art.
Figure 2B:
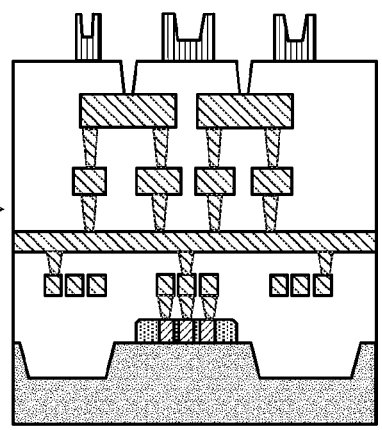
Figure 2C:
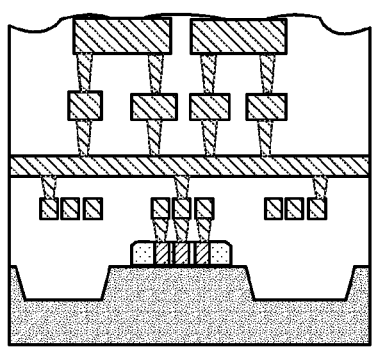

FIGS. 2A-2F illustrate an exemplary method for a conventional technique in accordance with the prior art to remove layers from a die 200. The initial die 200 typically includes a passivation layer 210 (e.g., a silicon oxide or silicon nitride film) that is not planarized over a metal layer 220 of the contact layer, as illustrated in FIG. 2A. The conductive layer includes a plurality of metal layers 230, 240, 250, 260, and a device layer 270 underlies the conductive layer. Step I includes removing the metal portions of the metal layer 220 of the contact layer, e.g., by reactive ion etching, thereby exposing the metal portions of the metal layer 230, followed by a wet chemical etch to remove the metal portions of the metal layer 220. The resultant structure is illustrated in FIG. 2B. Step II includes mechanical or chemical mechanical polishing to reduce the topography resulting from the etching of the metal portion of the metal layer 220 in Step I, leading to the topography illustrated in FIG. 2C.

Figure 2D:
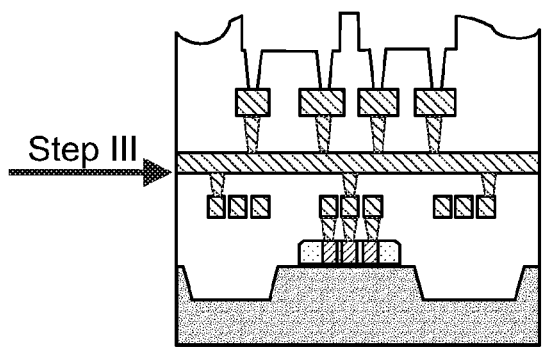
Figure 2E:
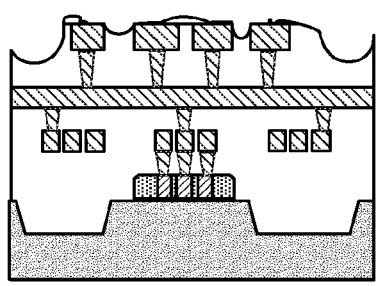
Figure 2F:
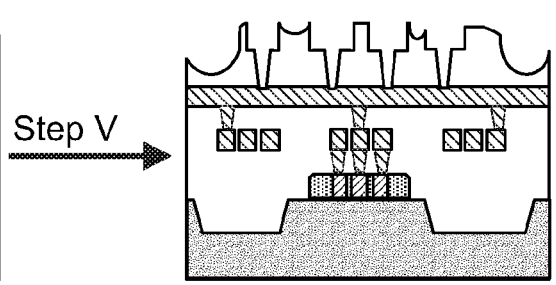

The next steps remove portions of the conductive layer, such as the metal layer 230 in proximity to the front-side surface of the conductive layer. The metal layer 230 is exposed by mechanical or chemical mechanical polishing alone or in conjunction with reactive ion etching after the topography is reduced. As illustrated in FIG. 2D after Step III, wet chemical etching of the metal layer 230 removes both the metal portion of the metal layer 230, along with the underling vias since these are formed using a dual damascene process. Further processing is required to access the deeper metal layers, for example, the metal layers 240, 250, 260, within the die 200. As illustrated in FIG. 2E, the result of Step IV, non-uniformity continues to develop due to polish rate differences between different materials, e.g., Cu and $SiO_2$, from the isotropic dry etching, from non-planar die mounting, and from die bow due to film stress mismatch. This further processing results in cumulative non-uniformity. As illustrated in FIG. 2F, after Step V, etching of the metal layer 240 within the conductive layer results in the exposure of multiple layers, including interlayer and intralayer dielectric material. Thus, the prior art process illustrated in FIGS. 2A-2F does not produce the desired layer-by-layer removal process.

FIGS. 3A-3F illustrate another exemplary conventional method for etching a die 300 in accordance with the prior art, which can be non-uniform across the die 300 and cannot be undertaken across an entire wafer. The method includes providing the die 300 having a passivation layer 310 that is not planarized over a metal layer 320 of the contact layer, as illustrated in FIG. 3A. The passivation layer 310 resists uniform polishing due to the SiN and the topography of the passivation layer 310 itself. Reactive ion etching is employed to expose the metal layer 320, as illustrated in FIG. 3B, and all topography is transferred down, so over-etching of the passivation layer 310 makes subsequent processing difficult. Removal of the metal portion of the metal layer 320 uses a wet chemical etch, the results of which are illustrated in FIG. 3C. The non-uniform topography illustrated in FIG. 3C may be caused by both the reactive ion etching and wet chemical etching of the metal layer 320. Reducing this topography uses mechanical or chemical mechanical polishing of the interlayer dielectric 380, the results of which are illustrated in FIG. 3D. Vias 370 and interlayer dielectric 380 may be present depending on the technology and layer of the die 300, resulting in the non-uniform topography illustrated in FIG. 3D. A metal layer 330 within the conductive layer is exposed, by way of either mechanical or chemical mechanical polishing or from reactive ion etching, as illustrated in FIG. 3E. Subsequent chemical removal of the metal layer 330 leaves an intralayer dielectric topography, as illustrated in FIG. 3F. The process may be repeated to uncover additional, deeper metal layers 340, 350, 360.

Figure 4A:
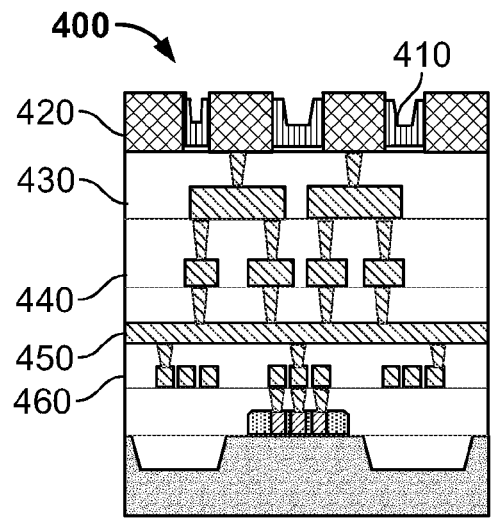
FIGS. 4A-4F illustrate an exemplary method for forming a delayered die in accordance with one or more embodiments of the present invention.
Figure 4B:
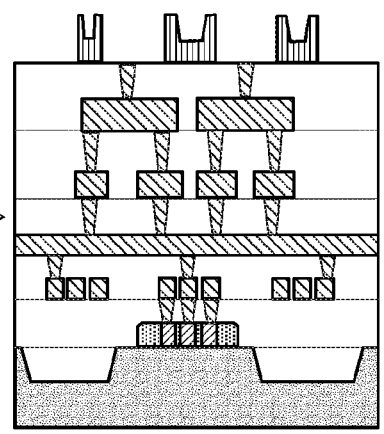
Figure 4C:
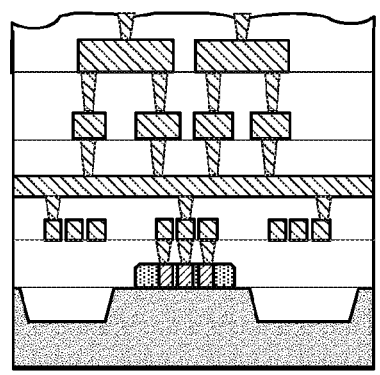
Figure 4D:
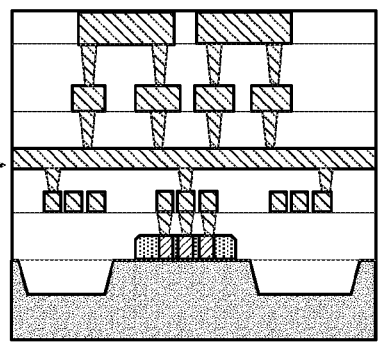

The present invention relates, in part, to employing plasma-based processes, i.e., using plasmas of one or more etching gases, to preserve a layer-by-layer removal process. As illustrated in FIGS. 4A-4F, an exemplary method in accordance with at least one embodiment of the present invention includes a first etching Step I of removing the metal portion of a metal layer 420 from the contact layer on the die 400 by using, for example, traditional reactive ion etching or wet chemical etching, the result of which is illustrated in FIG. 4B. A second etching Step II includes reducing the resulting topography, due, for example, to the passivation layer 410, by using, for example, mechanical or chemical mechanical polishing. When the topography is reduced, as illustrated in FIG. 4C, the die 400 is transferred to a plasma delayering process system. Exposing Step III includes exposing a metal layer 430 within the conductive layer by plasma-based etching (e.g., by use of a plasma of an etching gas). Exposure of the metal portion of the metal layer 430 can be identified by an endpoint detector. If the plasma-based etch is non-selective and not uniform at this point, the plasma chemistry or the physical aspects of the plasma dynamics can be changed to improve uniformity. The goal in exposing Step III, as illustrated in FIG. 4D, is to employ a mix of the plasma chemistry and physical aspects of the plasma dynamics such that materials are uniformly removed, i.e., the etch rates between materials are about the same and uniform spatial etching is achieved. For example, if the metal portion is removed primarily by the plasma chemistry, the dielectric portion is removed primarily by the physical aspects of the plasma dynamics, and the dielectric portion is being etched at a slower rate than the metal portion, then the physical aspects of the plasma dynamics can be increased by increasing the bias for the plasma-based etch, resulting in more energetic ions bombarding the surface, thereby increasing the physical aspects of the plasma dynamics, and increasing the etch rate for the dielectric portion. If the etch rate due to the plasma chemistry is less than the etch rate due to the physical aspects of the plasma dynamics, then the flow rate(s) of the etching gas(es), or even which etching gas(es) are being used, may be altered to equalize the etch rates.

Figure 4E:
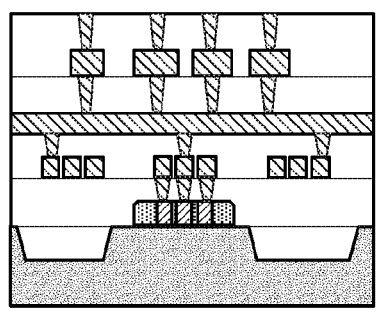
Figure 4F:
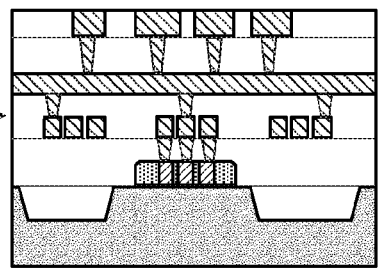

Exposing Step IV, the results of which are illustrated in FIG. 4E, includes removing the metal layer 430 in proximity to the front-side surface of the conductive layer by plasma-based etching, thereby exposing an interlayer dielectric and a plurality of vias. Again, this may require changing the plasma chemistry or the physical aspects of the plasma dynamics to achieve comparable etch rates between materials and uniform spatial etching. Exposing Step V results in exposing a metal layer 440 within the conductive layer, in which the exposure can again be detected with the end-point system. As with exposing Step IV, exposing Step V may require a change in the plasma chemistry or the physical aspects of the plasma dynamics to achieve comparable etch rates between materials and uniform spatial etching. As illustrated in FIGS. 4A-4F, this process in accordance with at least one embodiment of the present invention results in planar removal of the various layers. This process may be repeated as necessary to reach the deeper metal layers 450, 460.

FIGS. 5A-5F illustrate another exemplary method in accordance with one or more embodiments of the present invention employing plasma-based processes that non-selectively and uniformly remove each layer. Thus, layers including metal portions (e.g., interconnects and vias) as well as interlayer and intralayer dielectric can be removed at comparable rates. As each layer is removed, the underlying layers of a die 500 can be imaged and analyzed. This method can be applied to the single die 500 or to a full 300 mm wafer. In situ endpoint detection can be implemented between each etching or exposing steps.

FIG. 5A illustrates the starting state of the die 500, in which a polymer 510 can optionally be deposited over a passivation layer 520. The polymer 510 can act as a planarization layer, which provides a planar starting surface for the die 500. The entire surface of the die 500 is etched using a first plasma-based process until a metal layer 530 of the contact layer is exposed, as illustrated in FIG. 5B. Then, the entire die 500 can be etched using a second plasma-based process until the vias 580 are exposed between the metal layer 530 of the contact layer and a top metal layer 540 of the conductive layer, as illustrated in FIG. 5C. The second plasma-based process may be the same as or different from the first plasma-based process. The goal for each plasma-based process is to achieve comparable etch rates between materials and uniform spatial etching. Then, the entire die 500 is etched using a third plasma-based process until the metal layer 540 is exposed, as illustrated in FIG. 5D, in which the exposure can be detected with an end-point system. As illustrated in FIGS. 5E-5F, each subsequent metal layer 550, 560, 570, and corresponding vias may be exposed through subsequent etches employing plasma-based processes until the target layer is exposed.

FIGS. 6A-6F illustrate yet another exemplary method in accordance with one or more embodiments of the present invention employing plasma-based processes that selectively and non-uniformly remove the materials found in each layer. This exemplary method demonstrates the need for specific plasma etching gases to etch each individual material and depends on highly selective, uniform removal of the specific material. Topography may be present after certain plasma-based processes. As each layer is removed, the underlying material or layer of a die 600 can be imaged and analyzed. Such an approach can be applied to the single die 600 or to a full 300 mm wafer.

FIG. 6A illustrates the starting state of the die 600, in which a passivation layer 610 is not planarized. The entire die 600 is etched using a first plasma-based process (use of a first plasma of a first etching gas) until a metal portion of a metal layer 620 of the contact layer is exposed, as illustrated in FIG. 6B. This first plasma-based process is selective for the material of the passivation layer 610. Then, the entire die 600 can be etched using a second plasma-based process (use of a second plasma of a second etching gas, which can be the same or different from that used in the first plasma-based process) to remove the metal portion of the metal layer 620 of the contact layer, as illustrated in FIG. 6C. This second plasma-based process is selective for the material of the metal portion of the metal layer 620. Then, the vias 670 are etched selectively across the entire die 600 using a third plasma-based process (use of a third plasma of a third etching gas, which can be the same or different from that in the first or second plasma-based process), as illustrated in FIG. 6D. This third plasma-based process is selective for the material of the vias 670. Then, an interlayer dielectric 680 is etched selectively across the entire die 600 using a fourth plasma-based process (use of a fourth plasma of a fourth etching gas, which can be the same or different from that in the first, second, or third plasma-based process), as illustrated in FIG. 6E. This fourth plasma-based process is selective for the material of the interlayer dielectric 680. Exposure of the metal layer 630 by the fourth plasma-based process can be detected with an end-point system. A metal portion of the metal layer 630 of the conductive layer can be selectively etched using a fifth plasma-based process (use of a fifth plasma of a fifth etching gas, which can be the same or different from those in the first, second, third, or fourth plasma-based process) across the entire die 600, as illustrated in FIG. 6F. This fifth plasma-based process is selective for the material of the metal portion of the metal layer 630. These various plasma-based processes may be repeated as necessary to reach the deeper metal layers 640, 650, 660.

Additional plasma-based etching processes (e.g., mixed mode pulsing etching, high density plasma-based etching, etc.) are described in, e.g., C.T. Carver et al., "Atomic Layer Etching: An Industry Perspective," ECS Journal of Solid State Science and Technology, vol. 4, no. 6, pp.

N5005-N5009 (2015); C.M. Huard et al., "Atomic layer etching of 3D structures in silicon: Self-limiting and nonideal reactions," Journal of Vacuum Science and Technology A, vol. 35, no. 3, article no. 031306 (2017); K.J. Kanarik et al., "Atomic Layer Etching: Rethinking the Art of Etch," Journal of Physical Chemistry Letters, vol. 9, pp. 4814-4821 (2018); K.J. Kanarik et al., "Overview of atomic layer etching in the semiconductor industry," Journal of Vacuum Science and Technology A, vol. 33, no. 2, article no. 020802 (2015); S.A. Vitale et al., "Silicon etching yields in $F_2$, $Cl_2$, $Br_2$, and HBr high density plasmas," Journal of Vacuum Science and Technology A, vol. 19, no. 5, pp. 2197-2206 (2001); and D.D. Wang et al., "Two planar polishing methods by using FIB technique: Toward ultimate top-down delayering for failure analysis," AIP Advances, vol. 5, article no. 127101 (2015), as well as U.S. Pat. Publication Nos. 2013-0054153; 2016-0064281; 2016-0293756; 2016-0336183; 2016-0358782; 2017-0040214; 2017-0053810; 2018-0012729; 2018-0166272; 2019-0074184; and 2018-0174860; and U.S. Pat. Nos. 7,822,494; 8,303,833; 8,883,028; 8,994,112; 9,064,811; 9,245,885; 9,443,697; 9,640,531; 9,812,555; 9,837,312; and 9,972,565, each of which is incorporated herein by reference in its entirety.

Dies, Including Layers Thereof

The die can include any useful layer (e.g., a contact layer, a metal layer, a conductive layer, a device layer, or a substrate) composed of any useful material, such as microelectronic films, including oxides, metals, conductive materials, and low-k dielectric films using fluorine-based chemistries.

Exemplary conductive material includes, e.g., a metal, such as copper, gold, tungsten, cobalt, nickel, aluminum, ruthenium, molybdenum, tantalum, titanium, platinum, silver; a metalloid, such as silicon, including polycrystalline silicon; a polymer; a superconductor; a semiconductor; a ceramic; or a non-metallic conductor (e.g., graphite), as well as combinations thereof (e.g., alloys thereof).

The substrate can include any useful material or combination of materials and layers, such as silicon (e.g., Si or SiGe), poly-silicon (e.g., poly-Si), epitaxial silicon, gallium, gallium arsenide (e.g., GaAs), germanium (e.g., Ge), III-V materials (e.g., gallium nitride (GaN), gallium phosphide (GaP), gallium arsenide (GaAs), or indium phosphide (InP), including ternary III-V materials, such as aluminum gallium nitride (AlGaN), aluminum gallium arsenide (AlGaAs), indium gallium arsenide (InGaAs), and indium aluminum arsenide (InAlAs)), a buried oxide, a polymer, a dielectric (e.g., $SiO_2$, organosilicate glass, amorphous carbon, or diamond-like carbon (DLC)), an insulator (e.g., silicon nitride, silicon oxynitride, organosilicate glass, an oxide insulator (e.g., aluminum oxide, titanium oxide, or silicon oxide), a nitride insulator (e.g., aluminum nitride), a polymer insulator (e.g., a polyimide), or a dielectric, such as any described herein), an interlayer dielectric (e.g., a dielectric disposed between two layers), an intralayer dielectric (e.g., a dielectric disposed within a layer), as well as layers thereof or combinations thereof. The die or substrate can include one or more dielectric materials, such as a high k-dielectric (e.g., hafnium oxide (e.g., $HfO_2$), titanium oxide (e.g., $TiO_2$), beryllium oxide (e.g., BeO), silicon nitride (e.g., $Si_3N_4$), or aluminum oxide (e.g., $Al_2O_3$)). Another exemplary substrate includes one having a silicon-on-insulator (SOI) configuration.

Any of the materials herein may be further treated, such as by implantation (e.g., a punch stop implant process, ion implantation, or any other process to provide holes or electrons within a material), isolation (e.g., by installing a dielectric layer, an insulator layer, a sacrificial layer, or a shallow trench isolation (STI)), planarization (e.g., by mechanical or chemical mechanical polishing), masking, patterning, or etching.

Further exemplary materials and processes employing such materials are described in C. Boit, "New physical techniques for IC functional analysis of on-chip devices and interconnects," Applied Surface Science vol. 252, pp. 18-23 (2005); C. Boit et al., "Impact of Back Side Circuit Edit on Active Device Performance in Bulk Silicon ICs," Proceedings for the IEEE International Test Conference, held on 8-10 Nov. 2005 in Austin, TX, paper 48.2; C. Boit et al., "Physical Techniques for Chip-Backside IC Debug in Nanotechnologies," IEEE Design & Test of Computers, pp. 250-257 (2008); K. Chen et al., "Design-for-Debug Layout Adjustment for FIB Probing and Circuit Editing," Proceedings for the IEEE International Test Conference, held on 20-22 Sept. 2011 in Anaheim, CA, paper 10.2; M. Paniccia et al., "Novel Optical Probing and Micromachining Techniques for Silicon Debug of Flip Chip Packaged Microprocessors," Microelectronic Engineering vol. 46, pp. 27-34 (1999); R. Schlangen et al., "Electrical Performance Evaluation of FIB Edited Circuits through Chip Backside Exposing Shallow Trench Isolations," Microelectronics Reliability, vol. 45, pp. 1544-1549 (2005); and R. Schlangen et al., "Physical analysis, trimming and editing of nanoscale IC function with backside FIB processing," Microelectronics Reliability, vol. 49, pp. 1158-1164 (2009); as well as U.S. Pat. Publication Nos. 2013-0054153, 2016-0064281, 2016-0293756, 2016-0336183, 2018-0012729, 2018-0166272, and 2019-0074184, and U.S. Pat. Nos. 8,303,833, 8,994,112, 9,064,811, 9,245,885, 9,443,697, 9,640,531, 9,812,555, and 9,972,565, each of which is incorporated herein by reference in its entirety.

Plasmas and Etching Gases

A portion of a die (e.g., a layer, such as any described herein including a contact layer, a conductive layer, or a device layer, as well as portions thereof) can be removed by employing a plasma of an etching gas. A die or a portion thereof (e.g., a layer) can be removed by use of plasma etching, thereby providing a delayered die. Plasma etching can be achieved at any useful removal rate (e.g., about 1 nm/min).

An exemplary plasma can include any useful ions, including ions of argon, xenon, or an etching gas. An exemplary plasma can include an inductively coupled plasma (ICP). In one non-limiting embodiment, ICP is employed to have independent control of ion energy (e.g., less than about 15 eV) and of plasma flux. Exemplary etching gases can include any useful compound, such as a hydrocarbon, a halogen (e.g., chlorine, fluorine, etc.), a fluorocarbon (e.g., $CF_4$), or an organic moiety (e.g., a carbonyl or an acetate). The plasma can be formed in the presence of an optional carrier gas (e.g., an inert gas) and an etching gas (e.g., configured to remove material from the die or a layer thereof). Each step employing a plasma-based process can have a different plasma chemistry (e.g., a different etching gas or gases).

In some embodiments, a plasma-based process can include use of atomic layer etching (ALE), which uses at least two steps: modifying a surface with an etching gas followed by removing the modified surface by exposing it to a plasma (e.g., argon ions). The surface is modified by self-limiting adsorption of etching gases onto an exposed solid surface of a die. Exemplary etching gases can include, e.g., $Cl_2$, as well as any described herein. Exemplary substrates can include, e.g., silicon (Si), ruthenium (Ru), as well as materials including such elements, including silicon dioxide ($SiO_2$). Then, excess reactants from an etching gas are pumped out of the chamber, and the surface is exposed to low energy ion bombardment (or other forms of energy) to remove only the modified layer. The sequence is repeated until the desired depth is achieved. The process can be applied to any area, including large open areas or patterned areas.

An exemplary embodiment of the present invention uses a commercial plasma etch tool where as many as 8 gases controlled with Mass Flow Controllers (MFCs) can be connected to a gas manifold where the gases can be mixed and introduced into the chamber. This enables the use of various gas mixtures with the option to switch gas chemistries as different materials and different layers of materials are exposed.

Exemplary removing steps can include modifying a surface (e.g., a front-side surface of the die, such as a front-side surface of the contact layer, the conductive layer, a metal layer within the conductive layer) by exposure to an etching gas (e.g., within a chamber, such as a vacuum chamber), thereby providing a modified surface; optionally removing the etching gas; and then exposing the modified surface to a plasma, in which plasma-generated ions bombard the modified surface of the die and remove the modified surface. By controlling the extent of the modified surface (e.g., the depth of the modified surface, which can be at an atomic length), the amount of material to be removed can be controlled. Finally, the method can include repeating the steps of modifying the surface and exposing it to a plasma in order to arrive at the desired layer within the die.

Detecting a Metal Layer

The method can include any useful steps to detect a metal layer, such as by use of infrared (IR) navigation. Furthermore, graphic database system (GDS) overlays, if available, can be used to accurately locate the portions or layers within a die. Navigational fiducials can either be identified optically or deposited on or within the die to enable accurate location of delayering.

Optional Processing Steps

The methods herein can include any useful processing steps, which can be optional. In at least one embodiment of the present invention, a processing step can include removing an oxide layer from a die. Exemplary ways of removing an oxide layer can include exposure to a reactive vapor (e.g., HF vapor to remove an oxide layer from a die) or exposure to a wet chemical dip (e.g., wet HF chemical dip to remove an oxide layer from a die).

Optionally, if the die is part of a packaged device, then the sample can be encapsulated within a protective film (e.g., a parylene film) prior to the removing step. An access area can be patterned into the protective film, thereby opening the die surface, or a portion thereof, to the reactant to be employed during the delayering process. The treated sample can then be placed into a vacuum chamber to maintain the pristine surface.

Exemplary methods of employing a protective layer include milling a die (e.g., having a substrate, a device layer, a conductive layer, and/or a contact layer), encapsulating the die in a protective layer (e.g., a film of any useful material, such as a polymer like parylene), patterning the protective layer to provide an opening to access a front-side surface of the die, or a portion thereof, and removing a layer (e.g., an oxide layer or a portion of the contact layer) from the protected die that is in proximity to the opening.

One or more masks can be used to define a portion of a die of delayering. For instance, high resolution masks can be employed to define the opening over the desired portion of the die and may include spin-on-resists, dry film resists, spray-on-masks, or hard-masks. Masks can be deposited and patterned in any useful manner, such as by conventional lithography methodologies and masking materials (e.g., a photoresist or a hard mask, such as formed from SiCN, $SiO_2$, silicon nitride, amorphous carbon, or diamond-like carbon). In one embodiment, the method includes depositing a mask on a front-side surface of a die (e.g., an initial die, an etched die, or a delayered die) and then patterning the mask to provide one or more open regions, in which the open region(s) provide access to at least a portion of the front-side surface of the die. Then, etching through the open region(s) results in delayering in proximity to those open region(s).

In some embodiments, etching is achieved by employing an atomic layer etching process. For instance and without limitation, etching includes modifying a surface of an open region disposed on a front-side surface (e.g., of the die) by exposing the front-side surface to an etching gas, thereby providing a modified surface (e.g., as described herein) within the open region; and exposing the modified surface to a plasma that removes the modified surface. After etching, the mask may be optionally removed.

Example of a Plasma-Based Method for Uniform Delayering of a Die

The following is a non-limiting description of a method in accordance with one or more embodiments of the present invention to delayer anywhere from a single die up to a full 300 mm wafer using plasma-based processes to remove the material uniformly in a layer-by-layer method. The process can optionally include various ones of the steps recited below:

1. All processing occurs from the front side of the die or wafer. Initially, standard de-packaging/de-processing techniques are incorporated to allow access to the die or the die is completely removed from the package if the die is packaged.
2. Conventional sample preparation techniques are used to assure a smooth, uniformly thick surface is made available for initial plasma exposure.
3. For packaged devices, the die is first encapsulated in a protective film, for example, parylene, prior to plasma exposure. One or more holes are patterned into the protective film to open the die, or a portion thereof, to the plasma.
4. When working with an entire wafer, all die on the wafer can be handled identically.
5. The die/wafer goes into plasma etch chamber and is exposed to an etching gas (e.g., any described herein).
6. When metal is exposed, it should be identified by the endpoint detector. If the etch is non-selective and not uniform at this point, the plasma chemistry or the physical aspects of the plasma dynamics can be changed to improve uniformity.
7. The next layer that should be observed is an interlayer dielectric with corresponding vias. Again, this may require a change to the plasma chemistry or the physical aspects of the plasma dynamics to achieve comparable etch rates and uniform spatial etching.

8. Then, the next metal layer is exposed and detected with the end-point system. A change to the plasma chemistry or the physical aspects of the plasma dynamics may be required.
9. The steps (e.g., plasma etching steps) can be repeated until the desired layer is reached.

Other Embodiments

All publications, patents, and patent publications mentioned in this specification are incorporated herein by reference to the same extent as if each independent publication, patent, or patent publication was specifically and individually indicated to be incorporated by reference.

While the invention has been described in connection with specific embodiments thereof, it will be understood that it is capable of further modifications and this application is intended to cover any variations, uses, or adaptations of the invention following, in general, the principles of the invention and including such departures from the present disclosure that come within known or customary practice within the art to which the invention pertains and may be applied to the essential features hereinbefore set forth, and follows in the scope of the claims.

Other embodiments are within the claims.

The invention claimed is:

1. A method comprising:
providing a die, the die including:
a device layer;
a conductive layer including:
a first metal layer in proximity to a back-side surface of the conductive layer, the first metal layer including:
a first metal portion; and
a first intralayer dielectric;
a second metal layer in proximity to a front-side surface of the conductive layer, the second metal layer including:
a second metal portion; and
a second intralayer dielectric;
a plurality of first vias disposed between the first metal layer and the second metal layer; and
a first interlayer dielectric disposed between the first metal layer and the second metal layer; and
a contact layer including:
a passivation layer;
a third metal layer; and
a second interlayer dielectric disposed between the second metal layer and the third metal layer;
wherein the conductive layer is disposed between a front-side surface of the device layer and a back-side surface of the contact layer;
etching at least a portion of a front-side surface of the contact layer to expose at least a portion of the second metal layer, thereby providing an etched die;
exposing the etched die to a first inductively coupled plasma employing a first etching gas, the first inductively coupled plasma employing the first etching gas producing a first plasma etch, the first plasma etch chemically and physically removing at least a portion of the second metal layer, the first plasma etch being non-selective, the first plasma etch adapted to remove the second metal portion and the second intralayer dielectric at about the same rate;
exposing the etched die to a second inductively coupled plasma employing a second etching gas, the second inductively coupled plasma employing the second etching gas producing a second plasma etch, the second plasma etch chemically and physically removing at least a portion of the plurality of first vias and a portion of the first interlayer dielectric, the second plasma etch being non-selective, the second plasma etch adapted to remove the plurality of first vias and the first interlayer dielectric at about the same rate; and
detecting exposure of the first metal layer, thereby providing a delayered die.

2. The method of claim 1, wherein the etching step includes removing at least a portion of the passivation layer or at least a portion of the third metal layer.

3. The method of claim 1, wherein the etching step includes polishing at least a portion of the front-side surface of the contact layer to remove at least a portion of the passivation layer or at least a portion of the third metal layer.

4. The method of claim 1, wherein at least one of the first etching gas and the second etching gas includes at least one of a hydrocarbon, a halogen, a fluorocarbon, a carbonyl, and an acetate.

5. The method of claim 1, wherein the contact layer further includes a planarization layer disposed on a front-side surface of the passivation layer.

6. The method of claim 1, further comprising, after the providing step:
depositing a planarization layer on a front-side surface of the contact layer;
wherein the etching step includes etching at least a portion of the planarization layer.

7. The method of claim 1, further comprising, after the detecting exposure step:
exposing the delayered die to a third inductively coupled plasma employing a third etching gas, the third inductively coupled plasma employing the third etching gas producing a third plasma etch, the third plasma etch chemically and physically removing at least a portion of the first metal layer, the third plasma etch being non-selective, the third plasma etch adapted to remove the first metal portion and the first intralayer dielectric at about the same rate.

8. The method of claim 7, wherein the conductive layer further includes:
a plurality of third vias disposed between the device layer and the first metal layer; and
a third interlayer dielectric disposed between the device layer and the first metal layer.

9. The method of claim 8, further comprising, after the exposing the delayered die to a third plasma etch step:
exposing the delayered die to a fourth inductively coupled plasma employing a fourth etching gas, the fourth inductively coupled plasma employing the fourth etching gas producing a fourth plasma etch, the fourth plasma etch chemically and physically removing at least a portion of the plurality of third vias and a portion of the third interlayer dielectric, the fourth plasma etch being non-selective, the fourth plasma etch adapted to remove the plurality of third vias and the third interlayer dielectric at about the same rate.

* * * * *